United States Patent [19]

Chisholm

[11] Patent Number: 4,843,693
[45] Date of Patent: Jul. 4, 1989

[54] METHOD OF MAKING A CRIMPED WIRE MESH HEAT EXCHANGER/SINK

[76] Inventor: John Chisholm, 9337 S.E. River Ter., Jupiter, Fla. 33469

[21] Appl. No.: 159,329

[22] Filed: Feb. 23, 1988

Related U.S. Application Data

[63] Continuation-in-part of Ser. No. 864,315, May 19, 1986, abandoned.

[51] Int. Cl.$^4$ .............................................. B21D 53/02
[52] U.S. Cl. .................. 29/157.3 R; 29/428; 29/527.1; 228/173.6; 228/183; 228/206
[58] Field of Search ................ 29/157.3 D, 157.3 R, 29/4.5, 428, 527.1; 228/182, 183, 164, 173.1, 173.6, 203, 205, 206

[56] References Cited

U.S. PATENT DOCUMENTS

| | | | |
|---|---|---|---|
| 3,479,731 | 11/1969 | Mantel et al. | 228/182 |
| 4,130,233 | 12/1978 | Chisholm | 228/183 |
| 4,327,124 | 4/1982 | Des Marais, Jr. | 228/180.1 |

Primary Examiner—Carl E. Hall
Assistant Examiner—Irene Cuda

[57] ABSTRACT

In a compact heat sink the heat exchange surface consists of metal screen which has been crimped in a wavelike form and then brazed to a metal mounting base. The braze is along the trough of the wave where the mesh contacts the base. The base serves as a carrier for attaching the wire mesh to the object requiring heat transfer. The primary application of this form is heat sinking small electronic package such as "flat-packs" etc. An advantage of the design is that it makes a package which is physically compatible with miniature, low static pressure fans. A secondary form described in the disclosure is an air-to-air heat exchanger in which two crimped screens are attached to the base- one on either side. This application is useful for removing heat from a totally enclosed package. In this case the mounting base is larger than the crimped screen to allow for a flange of clear metal around the perimeter of the screen such that it may be attached to a prepared opening in the sealed package. The photograph attached to the disclosure depicts this type of application.

7 Claims, 2 Drawing Sheets

METHOD OF MAKING A CRIMPED WIRE MESH HEAT EXCHANGER/SINK

This application is a continuation-in-part of my co-pending application Ser. No. 06/864,315 filed on May 19, 1986, now abandoned.

CROSS-REFERENCES TO RELATED APPLICATIONS

The primary application of this invention is heat transfer from components of electronic circuit boards such as "flat-packs" etc. However, the manufacturing form and process disclosed teaches a method of making a compact heat sink/heat exchanger with utility in secondary applications. For example:
1. Heat removal from sealed enclosures
2. A corrugated structural form using crimped wire mesh brazed between metal plates.

BACKGROUND OF THE INVENTION

The subject of the invention is the process of making a heat exchanger/sink of fine wire screening bonded to a metal base by brazing such that the upper crimps of the screening are fixed in space and unimpaired by the braze.

DESCRIPTION OF THE PRIOR ART

There is a considerable body of overlapping information on the technology of bonding metal screening for the purposes of (1) Particulate Entrapment and (2) Screening for Heat Transfer Purposes. However, much of the bonding in the filter business has been accomplished by sintering the mesh as opposed to brazing. Prior art in the field of brazed wire mesh laminates marketed for heat sinks and flame arrestors (a special type of heat sink) is well established. See Chisholm U.S. Pat. Nos. 3,999,699, 4,130,233 and 4,359,181. In none of these applications is the requirement for compactness accompanied by moderate pressure drop as acute as in the cooling of micro-electronic packages. This invention addresses that requirement.

SUMMARY

The invention is an improved type of low-profile, compact heat sink/exchanger and manufacture of the same. The exchange surface consists of metal screen which is crimped in a wave-like form and bazed to a metal base. In some applications two crimped screens have the metal base sandwiched between them and in other forms the screening is partially enveloped by metal channel to serve as an air duct and/or structural member. The primary advantage of this form is in its compactness of fin surface while experiencing only moderate pressure drop. This combination combines favorably with the low pressure fans extensively used in modern electronic equipment.

BRIEF DESCRIPTION OF THE DRAWINGS

In the drawings (excepting FIG. 1) I have shown the woven wire mesh in various forms joined to a flat metal base.

DESCRIPTION OF THE PREFERRED EMBODIMENTS

A subtlety of this application of fine wire technology lies in control of the brazing material such that it does not wick the mesh openings by capillarity thereby resulting in blockage of the air passages. The control is accomplished by use of a finely divided brazing powder which is sparingly applied to the mesh but more liberally applied to the carrier base.

In the sense of this patent it is necessary to distinguish between two uses of the term "crimp", one usage implies the natural deformation of the wire weaving process and the other, a wave-like crimp resulting from a secondary crimping operation on the woven mesh. The natural deformation crimp design is used where there is not room in the electronic package for the added heat transfer surface resulting from the secondary wave-like crimp operation.

Figure 1:
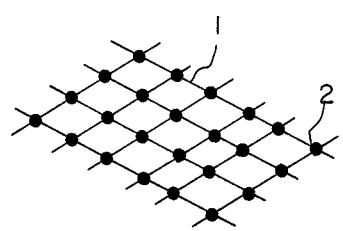
FIG. 1 is a fragmentary isometric view of a woven wire mesh showing the brazed wire crossings common to all the applications.

In all applications the mesh wire crossings are fixed in position by brazing. The wire crossings are shown in FIG. 1, Part 1 is the wire mesh and Part 2 is the braze. Where fine meshes are used special techniques are designated to preserve the mesh openings.

Figure 2:
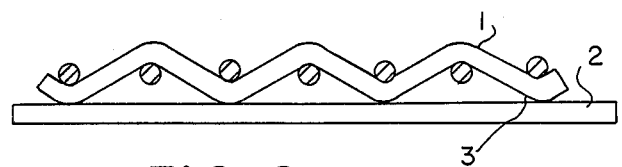
FIG. 2 is a blown-up elevation view of woven wire mesh brazed in a metal base and showing the natural crimp deformation resulting from the weaving process.

The natural deformation crimp is illustrated in FIG. 2, Part 1 is the mesh wire, Part 2 is the metal base and Part 3 is the braze. In this case, the inherent deformations of the wire weaving process in combination with fine control over the brazing powder distribution permits joining the mesh to the base carrier without saturating the upper loops of the mesh with brazing material. These open loops of the mesh are the primary heat transfer surface for a very low profile sink.

An important aspect of the invention is the preparation process for brazing. The steps of this process are common to all the exchanger/sinks described in the invention. The requirement is to apply brazing powder to mesh and base components in small but substantially different concentrations. An over abundance of powder on the fine weave will cause wicking, resulting in blockage of the air flow. However, a comparatively large deposit is required on the base carrier for good thermal conductivity to the mesh.

To satisfy this somewhat diverse requirement of powder deposition a two step preparatory procedure is required for applying the braze powder. In step 1, the powder is applied to the mesh only and in step 2, the powder is applied to the base only. Attempts to apply the powder in a single application result in unsatisfactory coverage. In both cases the small amount of brazing material precludes the use of convential brazing foils.

Control over the powder distribution is accomplished by use of a special container with perforated top whose number and size of perforations are established through experience. The powder is held in place by initally coating the parts with clear lacquer spray, lightly applied. The brazing powder adheres to the wet parts which quickly dry holding the powder in place. Volatile constituents of the lacquer evaporate and any residual is subsequently consumed in the brazing process.

Figure 3:
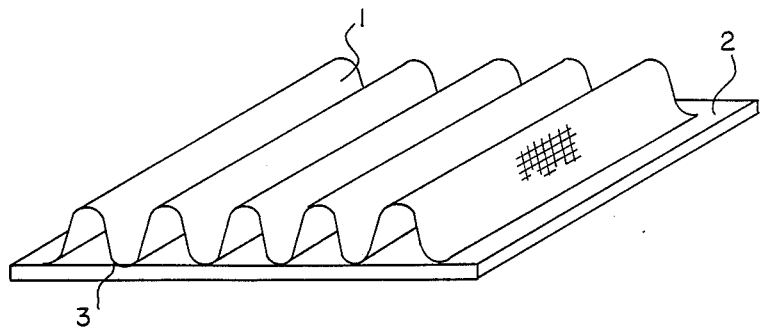
FIG. 3 is an isometric view of a wave-like crimped woven wire mesh which has been brazed to a flat metal base.

In FIG. 3, the wave-like mesh is shown; Part 1 is the mesh, Part 2, is the metal base and Part 3 is the braze. The base size is a function of the circuit package to which it will be attached. The thickness should be between 1/32" and ⅛". Thinner sections will not usually remain flat after brazing and heavier sections present too much mass for attachment to most electronic packages. The stock should be clean, flat and free of burrs. The wire mesh is then cut to an appropriate size for application to the carrier base.

Figure 4:
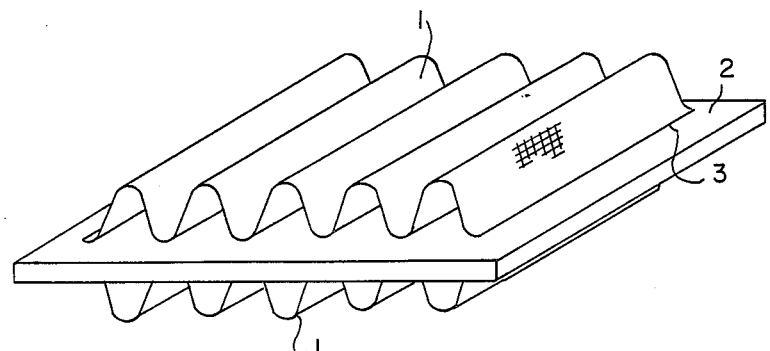
FIG. 4 is an isometric view of a pair of wave-like crimped woven wire meshes with a flat metal base brazed between them.
Figure 5:
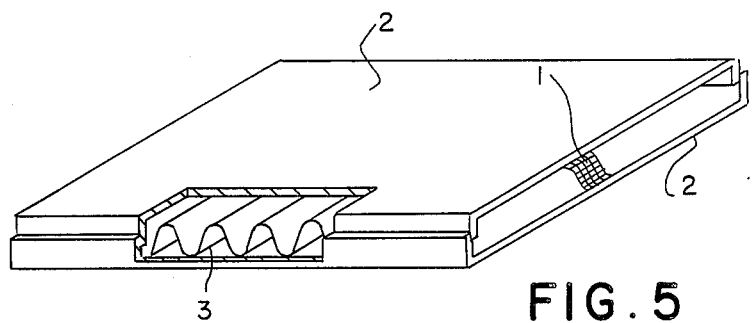
FIG. 5 is a sectioned isometric view of a wave-like crimped woven wire mesh enclosed on four sides by sheet metal formed into channels and brazed.

The crimping requirement shown in FIGS. 3, 4 and 5 may be done by passing the mesh through a crimping machine such as used in the sheet metal trade; other methods are also satisfactory. While the crimping machine produces a lineal wave-like crimp it is within the intent of the invention to include another wave form which would be characterized as radial. In this form the crimps would occur in radial succession about a center for either heat sinking or heat exchange purposes.

The parts should be thoroughly cleaned before applying spray lacquer to them. A commercial type vapor-degreaser or ultrasonic cleaner is satisfactory for this purpose. Cleaned parts should be stored in plastic bags while waiting for application of lacquer and brazing powder.

Brazing in an atmosphere of dry hydrogen (D.P. −60° F.) at 1500° F. produces an excellent bond. A high copper (or silver) brazing alloy is required for best thermal conductivity. A product known in the trade as "K-Braze" (William Krohn Co., Carlstadt, N.J.) has been found very suitable; its composition is 92.5% Cu and 7.5% P has The particle size of the powder is 100 mesh. Where close tolerances are required between parts it may be necessary to provide a jig or fixture to hold the desired relationship. However, for many simple assemblies no fixture is required and a carefully placed small weight is sufficient to hold the parts together while passing through the furnace. A piece of asbestos paper placed under the weight will separate the weight from the object being brazed.

FIG. 4 illustrates how the addition of a second wave-like crimped wire mesh properly placed on the underside of the heat sink creates a useful compact heat exchanger; Part 1 is the crimped mesh, Part 2 is the metal base and Part 3 is the braze. This type of exchanger has application for removing heat from sealed enclosures where it is necessary to separate internal and external atmospheres. For this application the base may have a clear rim around its edge for attachment to a prepared opening in the unit to be sealed. Attachments may be made with adhesives or soft solders. Heat transfer can be augumented by the addition by a pair of fans whose air streams impinge on the two meshes.

FIG. 5 illustrates a structural application of crimped mesh in which the peaks and troughs of the mesh are brazed inside formed metal channels. This type of assembly is useful for electronic packaging requirements where there are dual needs for load bearing and heat transfer. Part 1 is the crimped mesh, Part 2 is the channel and Part 3 is the braze. The channel flanges may be sealed by the same brazing techniques as already delineated. Brazing powder should be applied to both mating surfaces of the channel flanges.

Although I have illustrated preferred embodiments of my invention, it will occur to those skilled in the art that other modifications may be made without departing from the scope of the invention and that it is not my intention to limit the invention other than as necessitated by the scope of the appended claims.

I claim as new and desire to secure by Letters Patent of the United States is:

1. The process for making a heat sink from fine woven wire mesh brazed to a metal base with wire constituents fixed in position by brazing and mesh openings unobstructed to the passage of fluid, said process comprising the steps of cleaning said mesh and spraying one side of said mesh with a fast drying lacquer spray-lightly applied and applying braze powder to all the wetted surface in such quantity and uniformity that the mesh openings are maintained, placing the mesh on a cleaned metal base and brazing the mesh to the base in an atmosphere or vacuum furnace.

2. The process recited in claim 1 wherein the mesh has been initially crimped in wave-like form.

3. The process recited in claim 1 wherein a second crimped mesh of wave-like form has been placed under the first with the metal base sandwiched between.

4. The process for making a formed metal channel assembly, enclosed on four sides with crimped wave-like mesh brazed to the interior for structural and heat transfer purposes, said process comprising the steps of cleaning said mesh and spraying one side of said mesh with a fast drying lacquer-lightly applied and applying braze powder to all the wetted surface in such quantity and uniformity that the mesh openings are maintained, cleaning the channels, applying a fast drying lacquer spray to the channel interiors, applying braze powder to the wetted channels, placing the components in position with respect to each other, placing a small weight on the assembly with a sheet of asbestos paper between the assembly and weight, and brazing in an atmosphere or vacuum furnace.

5. The process of making a fine wire mesh with constituents fixed in position by brazing and with openings unobstructed to the passage of fluid, said process comprising the steps of cleaning said mesh and spraying one side of said mesh with a fast drying lacquer spray, lightly applied, and applying braze powder uniformly over the wetted surface in such quantity that the mesh openings are maintained, placing the mesh on a piece of asbestos paper and brazing said mesh in an atmosphere or vacuum furnace.

6. The process recited in claim 5 wherein the mesh is initially crimped in wave-like form.

7. The process recited in claim 5 wherein the mesh is crimped in wave-like form after brazing.

* * * * *